United States Patent
Lee et al.

(10) Patent No.: US 7,829,985 B2
(45) Date of Patent: Nov. 9, 2010

(54) BGA PACKAGE HAVING HALF-ETCHED BONDING PAD AND CUT PLATING LINE AND METHOD OF FABRICATING SAME

(75) Inventors: Hyo Soo Lee, Daejeon (KR); Sung Eun Park, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 104 days.

(21) Appl. No.: 12/315,721

(22) Filed: Dec. 4, 2008

(65) Prior Publication Data

US 2009/0093110 A1 Apr. 9, 2009

Related U.S. Application Data

(62) Division of application No. 11/155,142, filed on Jun. 16, 2005, now abandoned.

(30) Foreign Application Priority Data

Dec. 30, 2004 (KR) ...................... 10-2004-0116799

(51) Int. Cl.
 *H01L 23/495* (2006.01)
(52) U.S. Cl. ................ 257/666; 257/673; 257/E23.031; 257/E21.506; 257/E23.023; 257/E21.536; 438/612; 438/613; 438/614; 438/615; 438/616; 438/617; 438/123; 438/686; 438/584; 438/597
(58) Field of Classification Search ......... 438/612–617, 438/123, 686, 584, 597; 257/673, E23.031, 257/E21.506, E23.023, E21.536, 737, 666
See application file for complete search history.

(56) References Cited

U.S. PATENT DOCUMENTS

| 4,374,868 | A | * | 2/1983 | Stahl et al. .................. 205/126 |
| 5,158,645 | A | * | 10/1992 | Covert et al. .................. 216/13 |
| 5,284,548 | A | * | 2/1994 | Carey et al. .................... 216/18 |
| 5,877,559 | A | * | 3/1999 | Takayama et al. ........... 257/773 |
| 6,194,781 | B1 | | 2/2001 | Ikegami et al. |

(Continued)

FOREIGN PATENT DOCUMENTS

CN 1100349 3/1995

(Continued)

*Primary Examiner*—Fernando L Toledo
*Assistant Examiner*—Ankush K Singal
(74) *Attorney, Agent, or Firm*—Fish & Richardson P.C.

(57) ABSTRACT

A ball grid array (BGA) package having a half-etched bonding pad and a cut plating line and a method of fabricating the same. In the BGA package, the plating line is cut to form a predetermined uneven bonding pad using half-etching, thereby increasing the contact area between the bonding pad and a solder ball. The BGA package includes a first external layer having a first circuit pattern and a wire bonding pad pattern wherein a chip is connected to a wire bonding pad using wire bonding. A second external layer includes a second circuit pattern, a cut plating line pattern, and a half-etched uneven solder ball pad pattern. In the second external layer, another chip is mounted on a solder ball pad. An insulating layer having a through hole interposed between the first and second external layers and electrically connects the first and second external layers therethrough.

4 Claims, 8 Drawing Sheets
(3 of 8 Drawing Sheet(s) Filed in Color)

U.S. PATENT DOCUMENTS

| | | |
|---|---|---|
| 6,534,192 B1 | 3/2003 | Abys et al. |
| 6,872,590 B2 | 3/2005 | Lee et al. |
| 7,075,186 B1 * | 7/2006 | Wang et al. .................. 257/779 |
| 7,320,933 B2 * | 1/2008 | Lee et al. .................... 438/614 |
| 2003/0178229 A1 * | 9/2003 | Toyoda et al. ............... 174/261 |
| 2004/0020688 A1 | 2/2004 | Tsai et al. |
| 2004/0212030 A1 * | 10/2004 | Asai ........................... 257/432 |
| 2006/0012967 A1 * | 1/2006 | Asai et al. ................... 361/764 |
| 2006/0017151 A1 * | 1/2006 | Yoon et al. .................. 257/700 |

FOREIGN PATENT DOCUMENTS

| | | |
|---|---|---|
| JP | 10-32280 | 2/1989 |
| JP | 2001-358257 | 12/2001 |
| JP | 2004-214595 | 7/2004 |

* cited by examiner

FIG. 3
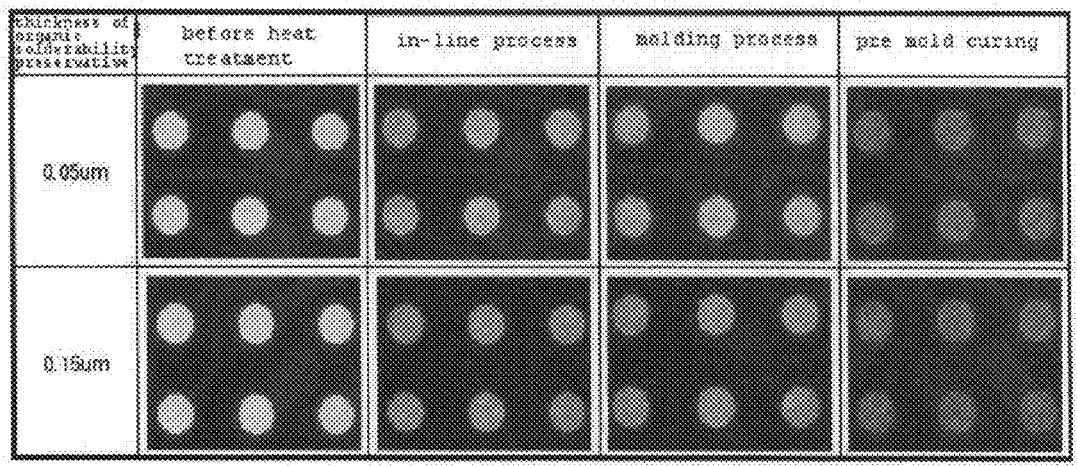
FIG. 4
FIG. 5
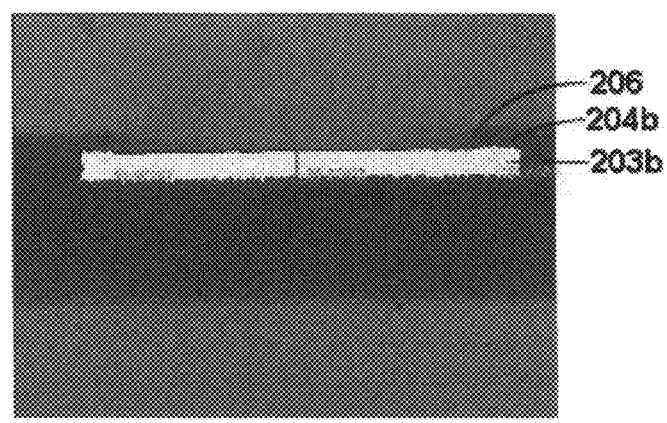

BGA PACKAGE HAVING HALF-ETCHED BONDING PAD AND CUT PLATING LINE AND METHOD OF FABRICATING SAME

The present application is a divisional of U.S. application Ser. No. 11/155,142, filed Jun. 16, 2005, which claims priority under 35 U.S.C. §119 to Korean Patent Application No. 10-2004-0116799 filed on Dec. 30, 2004. The content of the application is applications are incorporated herein by reference in its their entirety.

BACKGROUND OF THE INVENTION

1. Field of the Invention

The present invention relates to a BGA package having a half-etched bonding pad and a cut plating line and a method of fabricating the same. More particularly, the present invention pertains to a BGA package, in which a plating line is cut in a design step to form a predetermined uneven bonding pad using half-etching, thereby increasing the contact area between the bonding pad and a solder ball, assuring excellent surface properties and good drop test characteristics of the bonding pad, and a method of fabricating the same.

2. Description of the Related Art

An OSP (organic solderability preservative) surface treatment process is a technology capable of being used instead of conventional nickel/gold surface treatment, and may be used in cellular phones and portable electronic parts so as to realize excellent characteristics in a drop test. However, it is difficult to apply the OSP process, in which organics are applied on a copper pad, to conventional package processes. The reason for this is that an OSP layer on the copper pad is fatally damaged both thermally and physically while it is subjected to packaging steps, such as baking, wire bonding, die attach cure, and post mold curing, thus it is not easily removed by post flux in a solder junction process. Since this disadvantage forms a non-wetting zone on a solder surface and degradation of interface properties, it must be avoided. Recently, in order to avoid the above disadvantages, a half-etched copper pad is suggested before the OSP process, thereby improving properties of an OSP product. However, a severe chemical reaction, such as half-etching, depends on the design of a product.

FIG. 1 is a sectional view of a BGA package which is surface-treated using gold plating, according to the first embodiment of conventional technology.

As shown in FIG. 1, a circuit pattern 103a and a wire bonding pad pattern plated with gold 105a are provided on the upper side of an insulating layer 101, a chip 110 to be mounted is connected through wires 106 to a wire bonding pad, and a solder ball pad pattern including a circuit pattern 103b and a bonding pad plated with gold 105b is provided on the lower side of the insulating layer 101. A solder ball 107 is mounted on the ball pad. Furthermore, a through hole, for electrically connecting the upper and lower sides of the insulating layer 101 therethrough, is formed through the insulating layer 101.

With respect to this, the solder ball pad is surface-treated using the gold plating layer 105b. If the solder ball pad is surface-treated using the gold plating layer 105b, a plating line acts as an impedance in the formation of the gold plating layer 105b, thus electric properties are poor and undesirable characteristics, such as bending of a mold, occur. Additionally, undesirably, the solder ball is separated from the ball pad during a drop test.

To avoid the above problems, as shown in FIG. 2, OSP surface treatment is conducted.

FIG. 2 is a sectional view of a BGA package subjected to an OSP surface treatment process, according to the second embodiment of conventional technology.

As shown in FIG. 2, a circuit pattern 203a and a wire bonding pad pattern plated with gold 205 are provided on the upper side of an insulating layer 201, a chip 210 to be mounted is bonded through wires 207 to a wire bonding pad, and a solder ball pad pattern including a circuit pattern 203b and a bonding pad treated with OSP 206 is provided on the lower side of the insulating layer 201. A solder ball 208 is mounted on the ball pad. Furthermore, a through hole, for electrically connecting the upper and lower sides of the insulating layer 201 therethrough, is formed through the insulating layer 201.

However, as shown in FIG. 3, in a BGA package process using an organic solderability preservative (OSP), the organic solderability preservative (OSP) applied on the plating layer in which the solder ball pad is to be formed is thermally damaged during an in-line process or a back-end process. Particularly, it is thermally fatally damaged during a process of post mold curing (PMC) conducted at a high temperature of 175° C. or higher comprised in the back-end process.

In other words, as shown in FIG. 4, on the plating layer in which a bonding finger of the BGA package substrate or the solder ball pad is formed, as shown in a ball shear test, the organic solderability preservative (OSP), thermally damaged during the in-line process or the back-end process, remains.

In this regard, as shown in FIG. 5, when the solder ball is bonded to the plane copper plating layer 203b which is not vertically etched while the thermally damaged organic solderability preservative (OSP) 206 remains, the bonding area between the copper plating layer 203b and the solder ball 208 is reduced due to the remaining organic solderability preservative 206. Furthermore, the interaction of tin, which is contained in copper and the solder ball 208 constituting the copper plating layer 203b, with other metals is suppressed to interrupt the formation of intermetallic compound 1200 as shown in FIG. 6.

Accordingly, as shown in FIG. 6, the solder ball 208 is not attached to the copper plating layer 203b or easily separated therefrom by external impact, thus causing reduced reliability, such as formation of a non-wetting zone on a solder surface and degraded interface characteristics.

SUMMARY OF THE INVENTION

Accordingly, the present invention has been made keeping in mind the above problems occurring in the prior art, and an object of the present invention is to provide a BGA package having a half-etched bonding pad and a cut plating line, which has excellent electric properties and in which bending of a mold does not occur and a solder ball is not separated from the pad during a drop test, and a method of fabricating the same.

In order to accomplish the above object, the present invention provides a BGA package having a half-etched bonding pad and a cut plating line. The BGA package comprises a first external layer which includes a first circuit pattern and a wire bonding pad pattern and in which a chip is connected to a wire bonding pad using wire bonding; a second external layer which includes a second circuit pattern, a cut plating line pattern, and a half-etched uneven solder ball pad pattern and in which another chip is mounted on a solder ball pad; and an insulating layer having a through hole, which is interposed between the first and second external layers and electrically connects the first and second external layers therethrough.

Furthermore, the present invention provides a method of fabricating a BGA package having a half-etched bonding pad and a cut plating line. The method includes the steps of providing a substrate which includes a first external layer, a second external layer, and an insulating layer interposed between the first and second external layers; forming a through hole for electrically connecting the first and second external layers therethrough; forming a first pattern which includes a first circuit pattern and a wire bonding pad pattern on the first external layer, and forming a second pattern which includes a second circuit pattern, a cut plating line pattern, and a solder ball pad pattern on the second external layer; applying solder resists on the first and second external layers, and half-etching the solder ball pad pattern of the second external layer; and gold-plating the wire bonding pad pattern of the first external layer and forming an uneven solder ball pad from the solder ball pad pattern of the second external layer to surface-treat a resulting structure.

BRIEF DESCRIPTION OF THE DRAWINGS

The patent or application file contains at least one drawing executed in color. Copies of this patent or patent application publication with color drawing(s) will be provided by Office upon request and payment of the necessary fee.

The above and other objects, features and advantages of the present invention will be more clearly understood from the following detailed description taken in conjunction with the accompanying drawings, in which:

FIG. 3 illustrates in a stepwise fashion thermal damage to a bonding pad due to heat curing treatment of a conventional BGA package process;

FIG. 4 illustrates interface destruction between a solder ball and a bonding pad by an organic solderability preservative which is thermally damaged due to heat curing treatment of the conventional BGA package process;

FIG. 5 is a picture which illustrates a bonding pad having an one-dimensional shape fabricated through a conventional BGA package process;

DETAILED DESCRIPTION OF THE INVENTION

Figure 1:
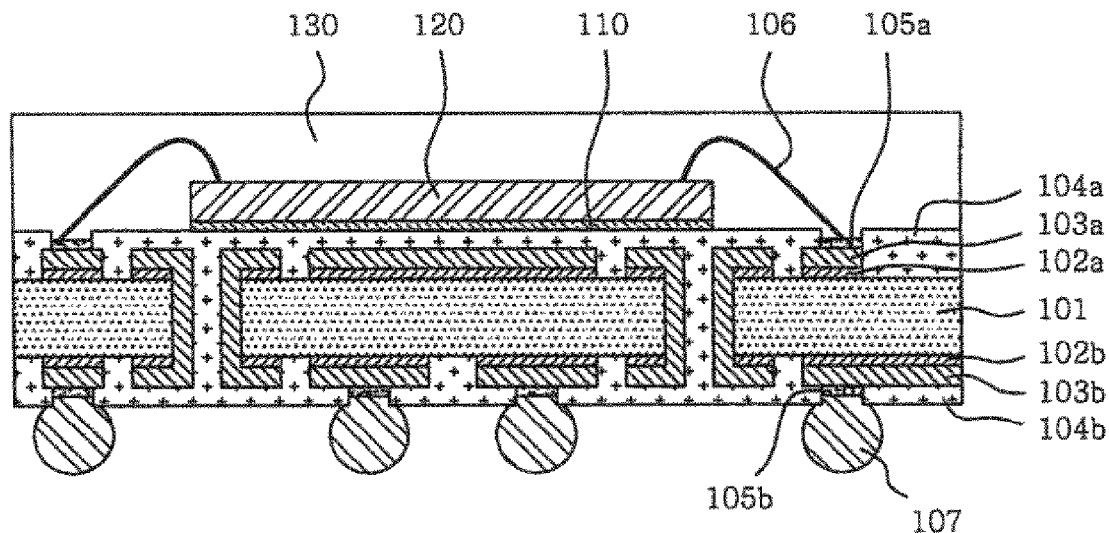
FIG. 1 is a sectional view of a BGA package which is surface-treated using gold plating, according to the first embodiment of conventional technology.
Figure 2:
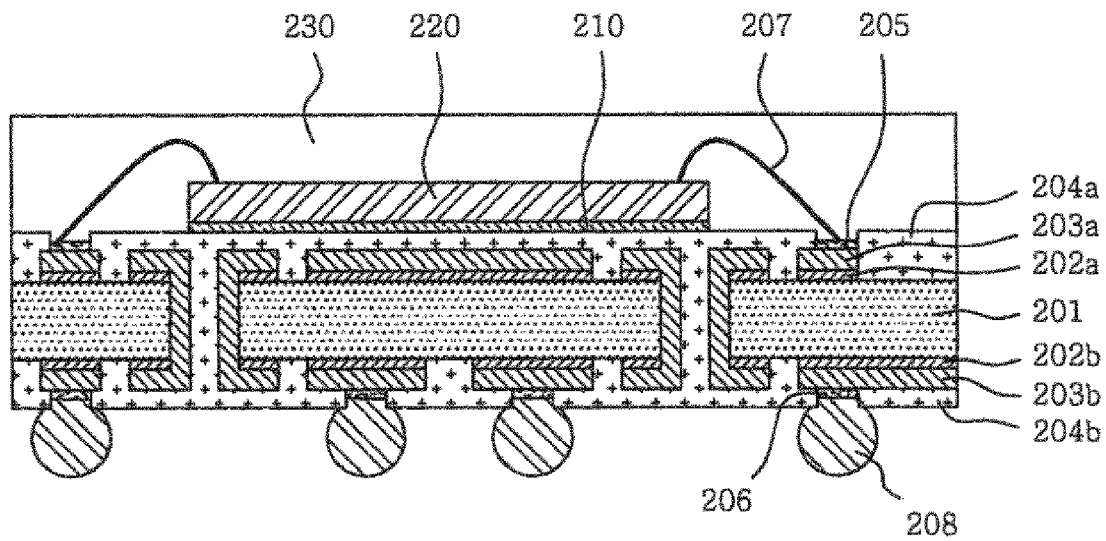
FIG. 2 is a sectional view of a BGA package which is subjected to an OSP surface treatment process, according to the second embodiment of conventional technology.
Figure 6:
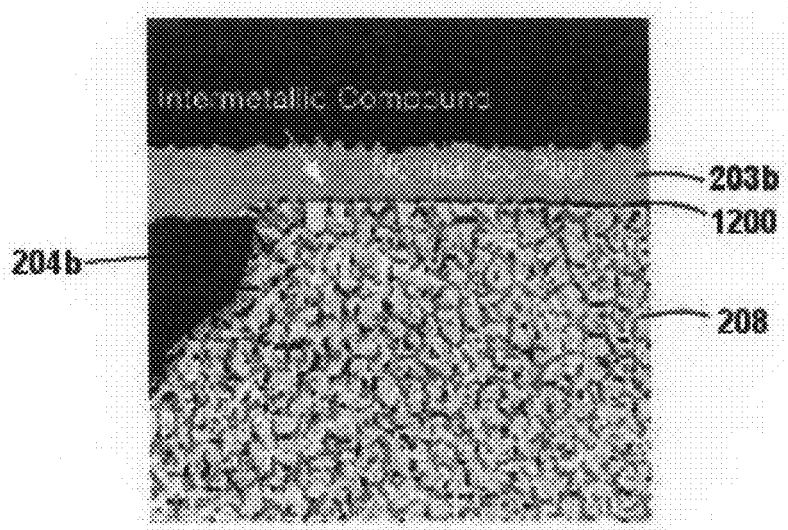
FIG. 6 is an expanded picture of a solder ball attached to the bonding pad having the one-dimensional shape fabricated through the conventional BGA package process.

Hereinafter, a detailed description will be given of the present invention, referring to the drawings.

Figure 7:
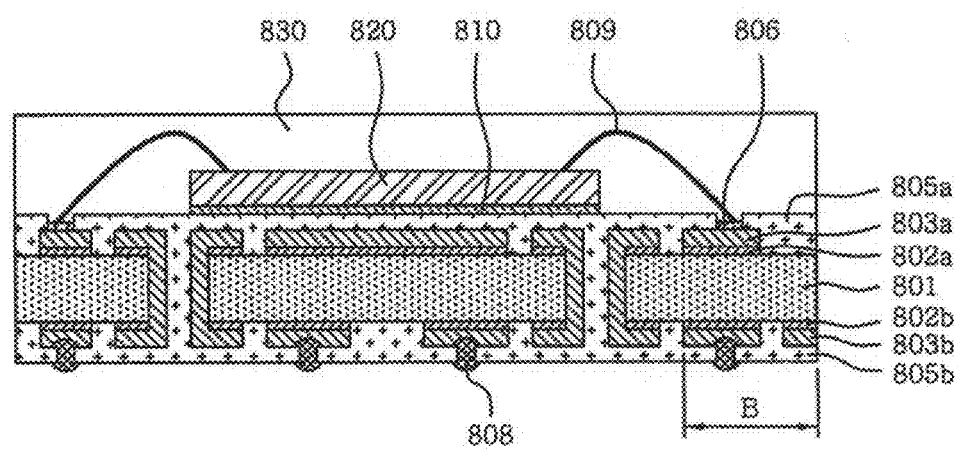
FIG. 7 is a sectional view of a BGA package which includes a half-etched bonding pad and a cut plating line fabricated according to the method of the present invention.

FIG. 7 is a sectional view of a BGA package which includes a cut plating line fabricated according to the method of the present invention.

As shown in FIG. 7, a circuit pattern 803a and a wire bonding pad pattern are provided on an upper side of an insulating layer 801, a chip 820 is connected through wires 809 to a wire bonding pad, and a circuit pattern 803b, a cut plating line pattern (B), and a half-etched uneven solder ball pad pattern are provided on a lower side of the insulating layer 801. A solder ball 808 is mounted on the ball pad.

Furthermore, a through hole for electrically connecting the upper and lower sides of the insulating layer 801 therethrough is formed through the insulating layer 801. A gold plating layer 806 is formed on a wire bonding pad pattern, and the solder ball 808 has the shape of a bird's bill which extends to the lateral surface of the bonding pad coated with a solder mask.

Due to the above structural characteristics, the solder ball 808 is not separated from the solder ball pad during a drop test.

Figure 8A:
FIGS. 8A to 8N are sectional views illustrating the fabrication of the BGA package which includes the half-etched bonding pad and the cut plating line, according to the present invention.
Figure 8B:
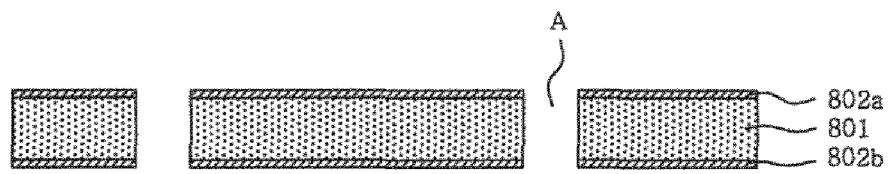
Figure 8C:
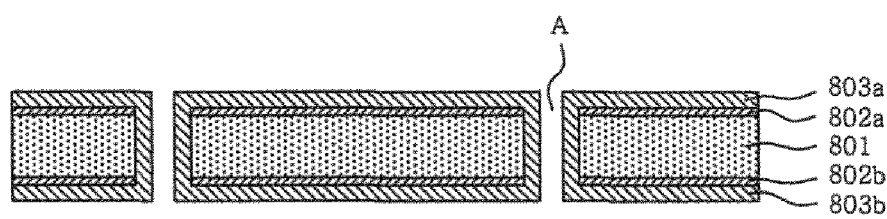
Figure 8D:
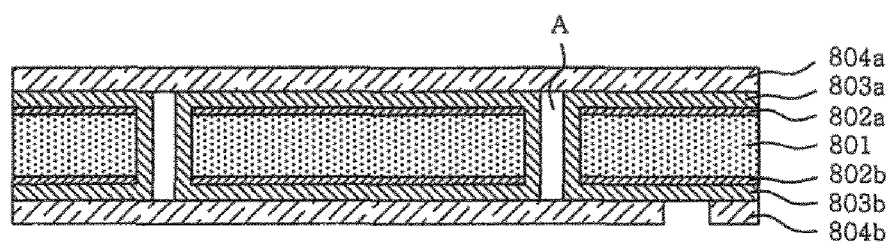
Figure 8E:
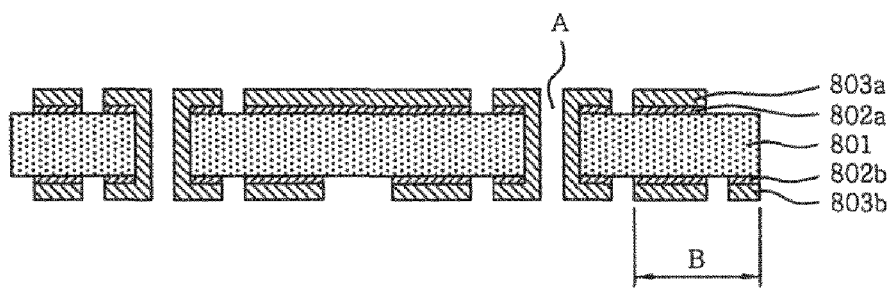
Figure 8F:
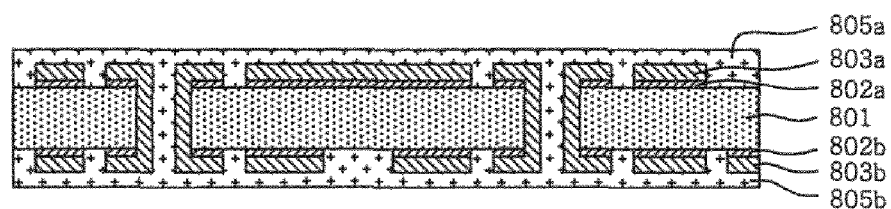
Figure 8G:
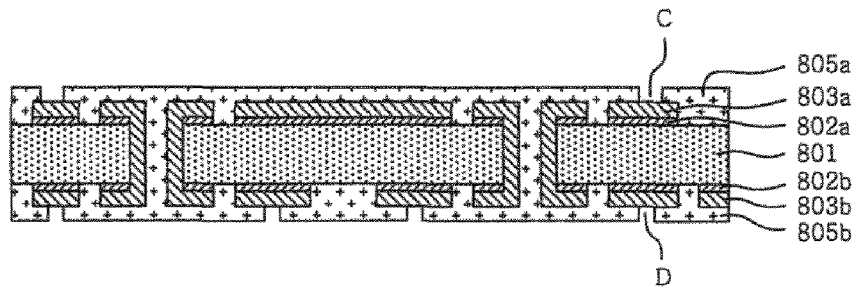
Figure 8H:
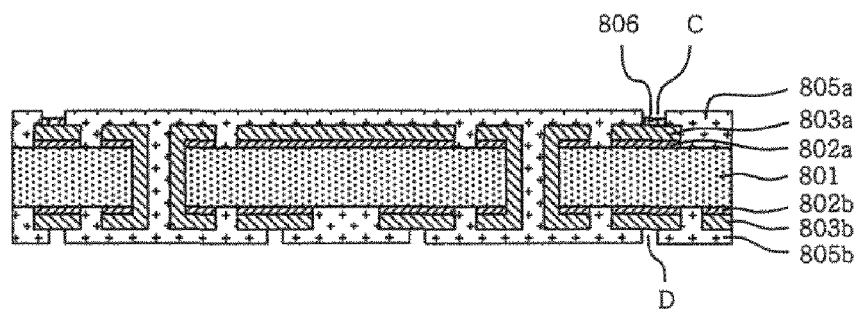
Figure 8I:
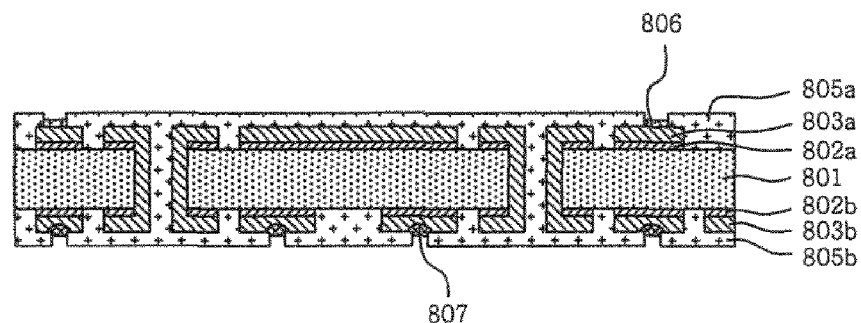
Figure 8J:
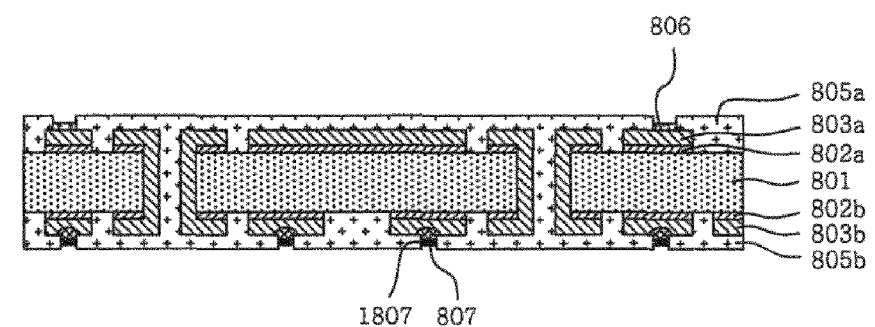
Figure 8K:
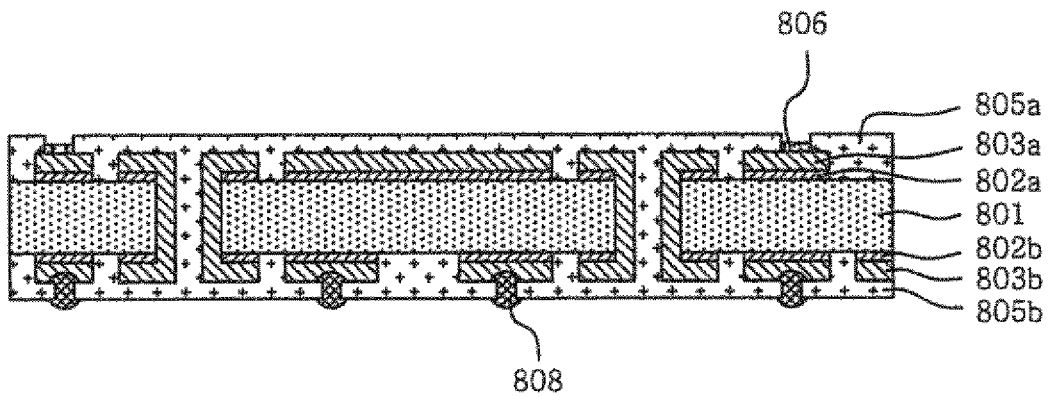
Figure 8L:
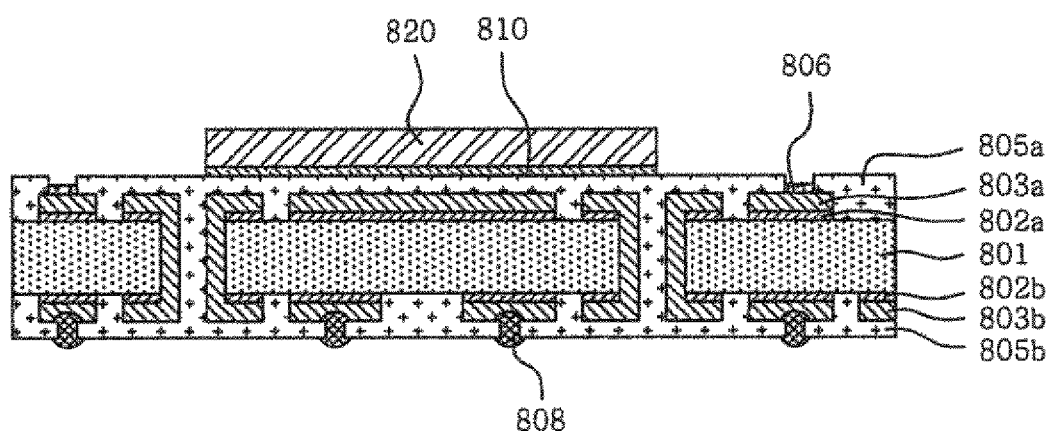
Figure 8M:
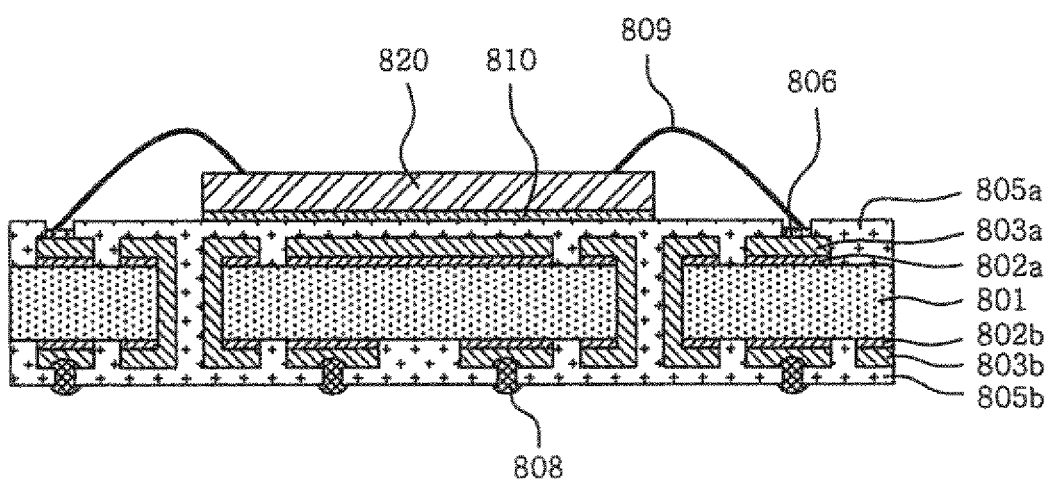
Figure 8N:
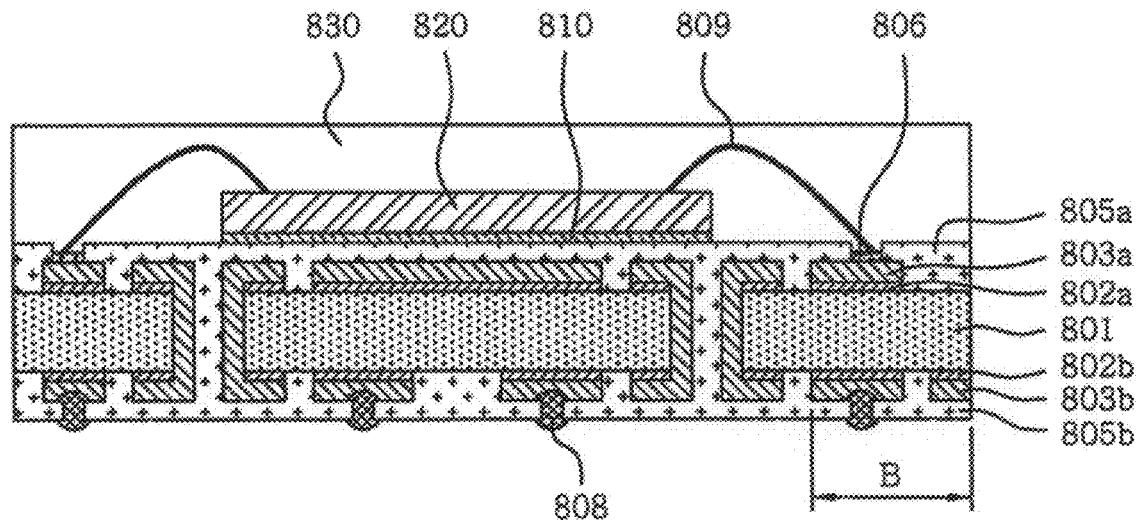

FIGS. 8A to 8N are sectional views illustrating the fabrication of a BGA package which includes a cut plating line, according to the present invention.

As shown in FIG. 8A, a substrate 800, that is, a copper clad laminate (CCL), in which copper foils 802a, 802b are applied on both sides of an insulating resin layer 801 is prepared.

In this respect, the copper clad laminate is classified into a glass/epoxy copper clad laminate, a heat-resistant resin copper clad laminate, a paper/phenol copper clad laminate, a high frequency copper clad laminate, a flexible copper clad laminate (polyimide film), or a complex copper clad laminate, depending on its application. However, the glass/epoxy copper clad laminate is most frequently used to fabricate a double-sided printed circuit board and a multilayered printed circuit board.

Furthermore, a substrate 800 having no internal layer is used in the present invention, but a multilayered substrate having an internal layer consisting of 2, 4, or 6 layers may be used depending on the purpose and application.

Next, as shown in FIG. 8B, a through hole (A) is mechanically formed to electrically connect upper and lower sides of the CCL as internal core material therethrough.

In order to electrically connect wires, the perpendicular through hole (A) must be precisely formed through upper and lower parts of the substrate. Additionally, a deburring process is conducted to remove burrs of the copper foils generated during a drilling process, dust particles on the wall of the hole, and dust and fingerprints on surfaces of the copper foils. Since much heat is generated during the drilling process, resin melts, flows, and becomes attached to the wall of the hole, causing a smear. Hence, the quality of the copper plating on the wall of the hole is decisively reduced. Accordingly, a desmear must be conducted to remove the smear.

Subsequently, as shown in FIG. 8C, the surface of the substrate 800 and the wall of the through hole (A) are subjected to an electroless plating process and an electrolytic plating process, thereby forming copper plating layers 803a, 803b for electric connection.

With respect to this, the electroless copper plating process is first conducted, and the electrolytic copper plating process is then implemented. The reason why the electroless copper plating process is conducted before the electrolytic copper plating process is that it is impossible to conduct the electrolytic copper plating process using electricity on the insulating layer. In other words, an electroless copper plating process is conducted as pretreatment so as to form a thin conductive film needed to achieve the electrolytic copper plating process. Since the electroless copper plating process has disadvantages of a difficult treatment process and economic inefficiency, it is preferable to employ the electrolytic copper plating process in order to form a conductive portion.

Next, as shown in FIG. 8D, dry films 804a, 804b having predetermined patterns are applied.

Each of the dry films 804a, 804b consists of three layers: a cover film, a photoresist film, and a Mylar film, and the photoresist film acts mainly as a resist.

As shown in FIG. 8E, external layer circuits 803a, 803b having predetermined patterns are formed.

The procedure of forming the external layer circuits 803a, 803b is as follows. Firstly, the dry films 804a, 804b having the predetermined patterns printed thereon are exposed and developed to pattern the dry films 804a, 804b. Subsequently, the dry films 804a, 804b having the predetermined patterns are used as an etching resist, and an etchant is sprayed on the substrate 800 to etch portions of the upper and lower copper foils 802a, 802b and the copper plating layers 803a, 803b, which do not correspond in position to the predetermined patterns of the dry films 804a, 804b, thus removing them. Thereafter, the dry films 804a, 804b are stripped and thus removed from the upper and lower sides of the substrate 800, thereby forming the external layer circuits 803a, 803b.

Furthermore, a plating line (B) is cut by a predetermined pattern.

If half-etching is conducted without cutting the plating line (B), over-etching occurs due to galvanic corrosion. The galvanic corrosion is achieved by bringing two metals having different physical properties into contact with each other to promote the oxidation of one metal. In the present invention, two metals, Au and Cu, come into contact with each other. Since the plating line (B) for conventional gold plating exists in a design step, when a solder ball pad consisting of plated copper is half-etched, galvanic corrosion occurs. Accordingly, if the plating line (B) is cut, it is possible to prevent over-etching caused by galvanic corrosion.

Furthermore, the dry films 804a, 804b are used as the etching resist, but photosensitive material liquid may be used as the etching resist.

Thereafter, as shown in FIG. 8F, solder resists 805a, 805b are applied and then pseudo-dried.

If the substrate 800 on which circuit patterns are formed on the copper foils 802a, 802b and the copper plating layers 803a, 803b is stained with fingerprints, oil, and dust, the substrate 800 may not adhere closely to solder resists 805a, 805b formed in the subsequent process. Accordingly, before the solder resists 805a, 805b are applied, it is preferable to conduct pretreatment in which the surface of the substrate is washed and made rough so as to improve the adhesion strength between the solder resists 805a, 805b and the substrate 800.

Next, as shown in FIG. 8G, an opening (C) which corresponds in position to a wire bonding pad and an opening (D) which corresponds in position to the solder ball pad are formed using a laser.

In this respect, since use of the laser makes heating at a high rate possible, it is easy to process very hard material having a narrow thermal strain layer. Since use of the laser is conducted in a non-contact manner, desirably, tools are not abraded, it is possible to finely process parts having complicated shapes, and noise and vibration do not occur when working.

Furthermore, if a laser beam irradiates a material surface, the surface temperature of the material is rapidly increased, thus a surface portion is melted and vaporized simultaneously, thereby removing a target substance from the surface thereof.

It is preferable to remove remaining sand and impurities from a portion of the substrate 801 from which the solder resist layers 805a, 805b are removed using a plasma.

Subsequently, as shown in FIG. 8H, a gold plating layer 806 is formed on the wire bonding pad.

In this respect, the substrate 800 is immersed in a gold plating tub, and electrolytic gold plating is conducted using a direct rectifier, thereby forming a gold plating layer 806. With respect to this, it is more preferable to deposit gold by applying proper current to the direct rectifier after an area to be plated has been calculated.

As well, it is preferable to form the gold plating layer 806 after nickel has been thinly plated so as to increase the adhesion strength to gold.

Next, as shown in FIG. 8I, after the solder ball pad is subjected to a half-etching process, treatment is carried out using OSP 807.

In the OSP 807 process, organics are applied on the surface of a solder ball pad of a printed circuit board to prevent contact between air and a copper surface, thereby preventing copper from being oxidized. If the organics are not applied on the surface of a PCB pad in such a way that the organics uniformly cover the copper surface in the OSP 807 process, the copper foils may be oxidized, causing problems. Hence, it is preferable to use the OSP as soon as possible after a vacuum package is unsealed.

Furthermore, if a user's hand comes into contact with the OSP in the course of handling it, oxidation rapidly occurs due to salts on the hand, thus it must be handled with care.

Thereafter, as shown in FIG. 8J, post-flexes 1807 having a predetermined viscosity are applied on the solder ball pad.

The post-flexes 1807 contain alcohol and acidic components, thus dissolving the OSP 807 of imidazole, thereby removing the OSP 807 which is thermally damaged due to a high temperature caused by a pre mold curing process and which remains on the bonding pad.

As shown in FIG. 8K, the BGA package substrate is subjected to an IR reflow process at about 230-260° C. for 30 sec, thereby forming the BGA package in which the solder ball is attached to the uneven solder ball pad by an intermetallic compound formed through the IR reflow process.

When the bonding pad is unevenly formed, the intermetallic compound, which is formed by interaction between metals of copper constituting the bonding pad and tin contained in the solder ball 808, extends to a predetermined portion of a solder mask covering the bonding pad as well as the uneven bonding pad.

Furthermore, each of the solder balls 808 soldered to the uneven bonding pad has the shape of a bird's bill which extends to a predetermined portion of the bonding pad coated with the solder mask. Hence, they are not easily separated from the bonding pad by external impact, thereby assuring good drop test characteristics.

Next, as shown in FIG. 8L, a semiconductor chip 820 is mounted on the upper solder resist 805a using an additive 810.

Thereafter, as shown in FIG. 8M, the semiconductor chip 820 is bonded through wires 809 to the gold plating layer 806 on the wire bonding pad.

Finally, as shown in FIG. 8N, the resulting structure is molded using a sealant 830, thereby creating the BGA package according to the present invention.

Figure 9:
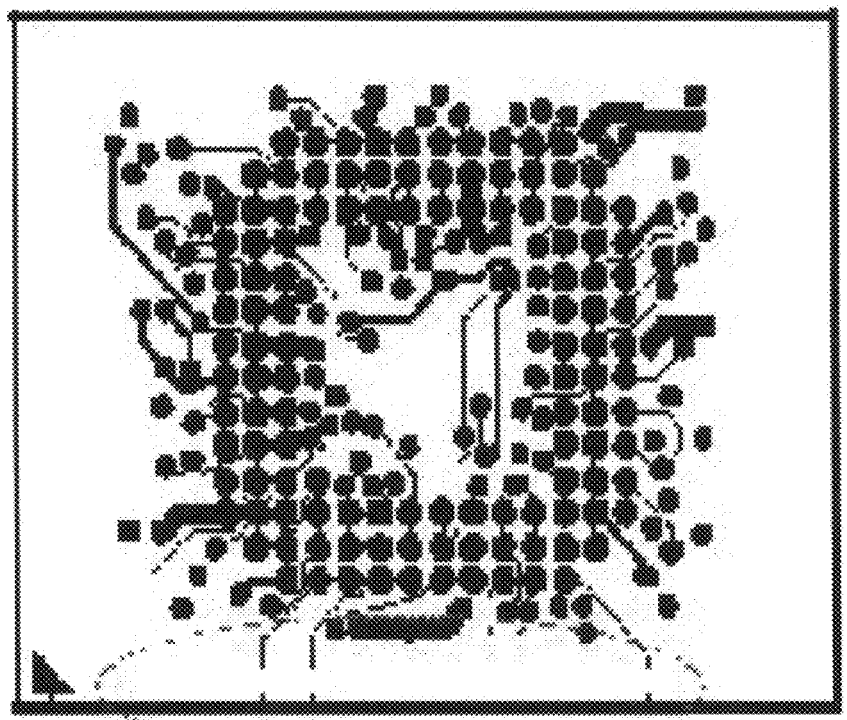
FIG. 9 illustrates a solder ball of the BGA package which includes the half-etched bonding pad and the cut plating line, according to the present invention.

FIG. 9 illustrates the solder ball of the BGA package which includes the half-etched bonding pad and the cut plating line, according to the present invention.

From the drawing, it can be seen that the plating line is cut, which is a characteristic of the present invention.

Figure 10:
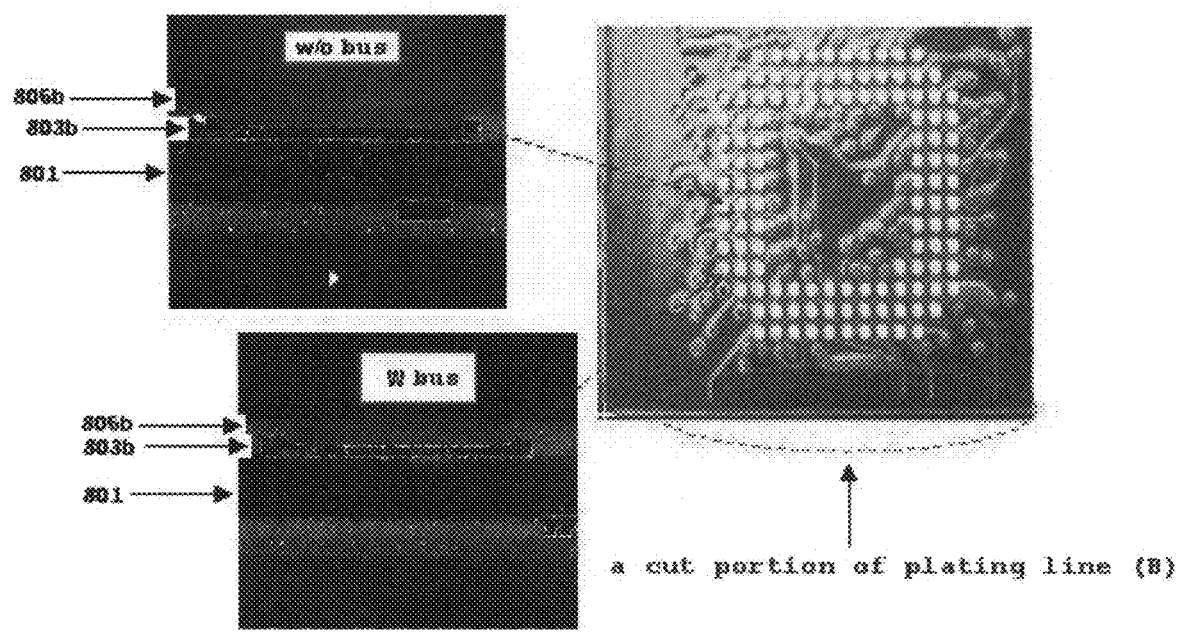
FIG. 10 is an optical picture which illustrates half-etching of the BGA package which includes the half-etched bonding pad and the cut plating line, according to the present invention.

Additionally, FIG. 10 is an optical picture which illustrates half-etching of the BGA package which includes the half-etched bonding pad and the cut plating line, according to the present invention.

In the drawing, the copper plating layer 803b for forming the solder ball pad on the insulating layer 801 is half-etched, and the solder resist 805b is applied on a portion other than the solder ball pad. Furthermore, the over-etching caused by galvanic corrosion is prevented by the cut plating line. When the copper plating layer 803b for forming the solder ball pad is half etched while the plating line is cut, an etching depth is 10-15 μm.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, a BGA package having a half-etched bonding pad and a cut plating line and a method of fabricating the same according to the present invention are advantageous in that a solder ball pad is surface-treated using an OSP, thereby preventing a mold from being bent.

Another advantage is that the attachment area of a solder ball is increased by its uneven shape, that is, a dumbbell shape, thus the solder ball is not separated in a drop test.

Still another advantage is that, since a plating line is cut in a design step, commercialization can be immediately achieved. Furthermore, since the plating line is cut so as to prevent galvanic corrosion, a copper plating layer is constantly etched (10-15 μm) during a half-etching process.

What is claimed is:

1. A method of fabricating a ball grid array (BGA) package having a half-etched bonding pad and a cut plating line, comprising the steps of:

providing a substrate having a first external layer, a second external layer, and an insulating layer interposed between the first and the second external layers;

forming a through hole for electrically connecting the first and the second external layers therethrough;

forming a first pattern having a first circuit pattern and a wire bonding pad pattern on the first external layer, and forming a second pattern having a second circuit pattern, a cut plating line pattern, and a solder ball pad pattern on the second external layer;

applying solder resists on the first and the second external layers, and half-etching the solder ball pad pattern of the second external layer; and gold-plating the wire bonding pad pattern of the first external layer and forming an uneven solder ball pad from the solder ball pad pattern of the second external layer to surface-treat a resulting structure.

2. The method as set forth in claim 1, further comprising the steps of:

mounting a first chip on the first external layer, and connecting the first chip to a wire bonding pad with wire bonding;

mounting a second chip on the solder ball pad pattern of the second external layer; and molding an end structure using a sealant, after the step gold-plating step.

3. The method as set forth in claim 1, wherein the gold-plating step further comprises the step of applying a surface treatment member on the uneven half-etched bonding pad wherein the surface treatment member is an organic solderability preservative (OSP).

4. The method as set forth in claim 1, wherein the step of providing a substrate further comprises the step of providing an insulating layer interposed between the first and second external layers wherein the insulating layer has an internal layer consisting of multiple layers.

* * * * *